US006921965B1

(12) United States Patent
Ray et al.

(10) Patent No.: US 6,921,965 B1
(45) Date of Patent: Jul. 26, 2005

(54) DIE SURFACE MAGNETIC FIELD SHIELD

(75) Inventors: Oindrila Ray, Palo Alto, CA (US); Frederick B. Jenne, Los Gatos, CA (US)

(73) Assignee: Silicon Magnetic Systems, San Jose, CA (US)

( * ) Notice: Subject to any disclaimer, the term of this patent is extended or adjusted under 35 U.S.C. 154(b) by 0 days.

(21) Appl. No.: 10/175,628

(22) Filed: Jun. 20, 2002

(51) Int. Cl.[7] .......................................... H01L 23/552
(52) U.S. Cl. ...................................... 257/659; 257/296
(58) Field of Search ................................ 257/659, 600, 257/296, 298, 300, 304, 305, 306, 311, 312, 275, 260, 261, 295, 314, 336

(56) References Cited

U.S. PATENT DOCUMENTS

| | | | |
|---|---|---|---|
| 4,922,606 A | * | 5/1990 | Alexander et al. ............. 29/839 |
| 5,902,690 A | | 5/1999 | Tracy et al. |
| 6,515,352 B1 | * | 2/2003 | Spielberger et al. ........ 257/659 |
| 6,724,027 B2 | | 4/2004 | Bhattacharyya et al. |

FOREIGN PATENT DOCUMENTS

JP          59102745      * 12/1985

* cited by examiner

Primary Examiner—Bradley Baumeister
Assistant Examiner—Dana Farahani
(74) Attorney, Agent, or Firm—Kevin L. Daffer; Mollie E. Lettang; Daffer McDaniel, LLP

(57) ABSTRACT

A semiconductor topography is provided which includes a magnetic field shield layer formed upon a semiconductor device. In particular, the semiconductor topography may include a ferromagnetic layer adapted to shield underlying layers from external magnetic fields. Such a ferromagnetic layer may include either ferrite and/or non-ferrite materials. In some embodiments, the semiconductor topography may include a magnetic field shield layer with a different pattern configuration than an adjacent passivation layer. Consequently, a method for processing a semiconductor topography which includes patterning a magnetic field shield layer to form openings other than bond pad openings within the semiconductor topography is provided.

14 Claims, 9 Drawing Sheets

DIE SURFACE MAGNETIC FIELD SHIELD

BACKGROUND OF THE INVENTION

1. Field of the Invention

This invention relates to semiconductor device manufacturing, and more particularly, to a magnetic field shield layer and a method for making the same.

2. Description of the Related Art

The following descriptions and examples are given as background only.

Several conditions may affect the operation of a semiconductor device. In particular, the ambient to which a device is exposed may affect the operation of a device. For example, exposure to extremely low or high temperatures may adversely affect the operation of a device. In addition or alternatively, the presence of stray or external magnetic fields may affect the functionality of a device. In particular, exposure to external magnetic fields may be particularly harmful for devices that include magnetoresistive memory cells, such as giant magnetoresistance (GMR) memory cells or magnetic tunnel junction (MTJ) memory cells. In general, magnetoresistive memory cells function by the application of magnetic field vectors. Magnetic field vectors applied over a particular threshold limit may cause a change in resistance by which states of a cell ("0" and "1") may be switched and by which the read and write operations of a device may be defined.

Preferably, the magnetic field vectors applied to a memory cell are generated by the integrated circuitry of the device comprising the cell such that the application of the fields may be controlled. In particular, the magnetic field vectors used to switch the state of a memory cell are preferably generated by current directed along the bit and/or digit lines of the device. External or stray magnetic fields, however, may cause states of the cell to switch independently of the magnetic field vectors generated from the device, causing the device to malfunction. "External" or "stray" magnetic fields may refer to magnetic field vectors that are present in the ambient of a device, distinct from those vectors that are generated by the circuitry of the device. Such external or stray magnetic fields may originate from a plurality of sources, such as neighboring electrical devices, for example. In addition, the thresholds at which states of cells switch continues to decrease as cell dimensions continue to decrease. Consequently, lower magnetic fields, including those applied by the circuitry of the device and external sources, may be capable of changing the states of memory cells with such decreased dimensions.

Furthermore, external or stray magnetic fields may be applied at any angle with respect to the memory cell. In general, magnetic field vectors applied either parallel or antiparallel across a junction of a magnetoresistive memory cell may cause a change in resistance within the cell, thereby causing the states of the cell to switch. Such an application of magnetic field vectors may be from external magnetic fields alone or in conjunction with magnetic field vectors generated by currents along the bit and digit lines as described above. In some cases, magnetoresistive memory cells may be designed such that switching of states may be easier with magnetic field vectors applied in one direction versus another direction. A memory cell with such adaptation may be configured in any shape, which has a longer dimension in one direction versus a second dimension of the shape. In such an embodiment, the direction by which magnetic fields may be applied such that switching is more easily obtained may be referred to as the "easy" axis. Such a direction may refer to the elongated portion of the memory cell. The respective shorter dimension of the memory cell may be referred to as the "hard" axis and may refer to the direction by which magnetic fields may be applied such that switching of the states of the cell is more difficult to obtain. Consequently, external magnetic fields applied along the easy axis of a magnetoresistive memory cell may be particularly harmful to the operation of a device comprising the memory cell.

It would therefore be desirable to develop a device that is shielded from external or stray magnetic fields. In particular, it may be advantageous to develop a device in which the easy axis of a memory cell is shielded. In other cases, it may be advantageous to fabricate a device in which the hard axis of the memory cell is additionally or alternatively shielded. In yet another embodiment, it may be desirable to develop a device that is shielded along any direction of a memory cell. Such an embodiment may be particularly advantageous for devices with memory cells that do not have easy and hard axes orientations.

SUMMARY OF THE INVENTION

The problems outlined above may be in large part addressed by a semiconductor topography having a layer adapted to shield external magnetic fields and a method for making such a topography. In particular, a semiconductor topography is provided which includes a non-ferrite ferromagnetic layer adapted to shield underlying layers from external magnetic fields. In other embodiments, the layer adapted to shield underlying layers of a semiconductor topography may include ferrite materials. In either case, the magnetic field shield (MFS) layer may be adapted to shield an entire topography excluding bond pads formed across the topography. In other cases, the layer may be adapted to shield portions of a topography. As such, a method is provided which includes patterning an MFS layer to form openings other than bond pad openings within a semiconductor topography. In some cases, the method may further include patterning a passivation layer arranged adjacent to the MFS layer with a different mask layer than is used for patterning the MFS layer. Consequently, a semiconductor topography is provided which includes an MFS layer with a different pattern configuration than an adjacent passivation layer.

As stated above, the semiconductor topography described herein may include ferrite and/or non-ferrite ferromagnetic materials. As such, in some embodiments, the semiconductor topography described herein may include a non-ferrite ferromagnetic layer adapted to shield underlying layers from external magnetic fields. In some cases, the non-ferrite ferromagnetic layer may be further adapted to prevent deterioration of the underlying layers. In yet other embodiments, the semiconductor topography described herein may include a ferrite ferromagnetic layer adapted to shield underlying layers from external magnetic fields. In some cases, the ferrite ferromagnetic layer may be further adapted to prevent deterioration of the underlying layers. In either embodiment, the ferrite or non-ferrite ferromagnetic layer may serve as an MFS layer for the semiconductor topography.

In addition, the semiconductor topography may include a magnetoresistive memory cell arranged below the MFS layer. In some embodiments, the pattern configuration of the MFS layer may include portions of the MFS layer arranged in alignment with the easy axis of the magnetoresistive memory cell. In addition or alternatively, the pattern configuration of the MFS layer may include portions of the MFS layer arranged in alignment with the hard axis of the magnetoresistive memory cell. In other words, the pattern configuration of the MFS layer may include portions of the MFS layer arranged in alignment with the easy and/or hard axis of the magnetoresistive memory cell. In yet other embodiments, the pattern configuration of the MFS layer may include portions of the MFS layer arranged at an angle respective to the easy axis of the magnetoresistive memory cell. In particular, the MFS layer may include portions arranged at an angle between approximately 0 degrees and approximately 90 degrees with respect to the easy axis of the magnetoresistive memory cell.

In addition or alternatively, the semiconductor topography may include a passivation layer adapted to prevent deterioration of the underlying layers. In some cases, the passivation layer may be arranged below the MFS layer. In yet other embodiments, the passivation layer may be arranged above the MFS layer. In either case, the MFS layer may include a different pattern configuration than the passivation layer in some embodiments. Consequently, the MFS layer and passivation layer may be formed from different masking layers in such an embodiment. Alternatively, the MFS layer may include the same patterned configuration as the passivation layer. In such an embodiment, the MFS layer and the passivation layer may be formed from the same masking layer or different masking layers. In some embodiments, the semiconductor topography may include one or more additional layers that are adapted to shield the underlying layers from external magnetic fields. Such additional layers may include any ferromagnetic materials, including ferrite and/or non-ferrite ferromagnetic materials. In addition, the semiconductor topography may further include one or more dielectric layers such that the MFS layer and the one or more additional layers may be spaced laterally adjacent to each other by the one or more dielectric layers.

A method for processing a semiconductor topography is also contemplated herein. The method may include patterning a MFS layer to form openings other than bond pad openings within a semiconductor topography. In some cases, the method may further include patterning a passivation layer to form the bond pad openings. In some embodiments, the method may include depositing the passivation layer upon the MFS layer subsequent to patterning the MFS layer. In other embodiments, the method may include depositing the MFS layer upon the passivation layer prior to patterning the passivation layer. In such an embodiment, patterning the MFS layer may be conducted prior to patterning the passivation layer in some cases. Alternatively, patterning the MFS layer may be conducted subsequent to patterning the passivation layer. Consequently, patterning the passivation layer, in such an embodiment, may include etching a portion of the MFS layer. In either embodiment, patterning the passivation layer may include using a different mask than is used to pattern to MFS layer.

There may be several advantages for forming a topography with a MFS layer as described herein. For example, a topography with such a layer may be protected from external magnetic field vectors present within the ambient of the topography. In addition, such an MFS layer may advantageously retain the magnetic field vectors generated by the circuitry of a topography. Such retention of magnetic field vectors may allow a lower magnetic field to be applied to the memory cell, since the strength of the generated magnetic field will not dissipate. In some embodiments, an MFS layer as described herein may be used for shielding portions of a topography. In such an embodiment, the topography may advantageously have a relatively thin MFS layer. In particular, a magnetic field shield that is adapted to shield portions of a topography, such as the easy and/or hard axes of a memory cell junction, for example, may be thinner than a magnetic field shield that is adapted to shield an entire topography with the exclusion of bond pads. Furthermore, the MFS layer described herein may be fabricated during the fabrication process of the device (i.e., at "wafer level"). In this manner, a plurality of devices may be suited with a MFS layer at one time. Consequently, fabrication costs may be reduced. In addition, production yield may be improved since the devices will be protected from external magnetic fields between the fabrication and packaging processes.

BRIEF DESCRIPTION OF THE DRAWINGS

Other objects and advantages of the invention will become apparent upon reading the following detailed description and upon reference to the accompanying drawings in which.

Figure 1:
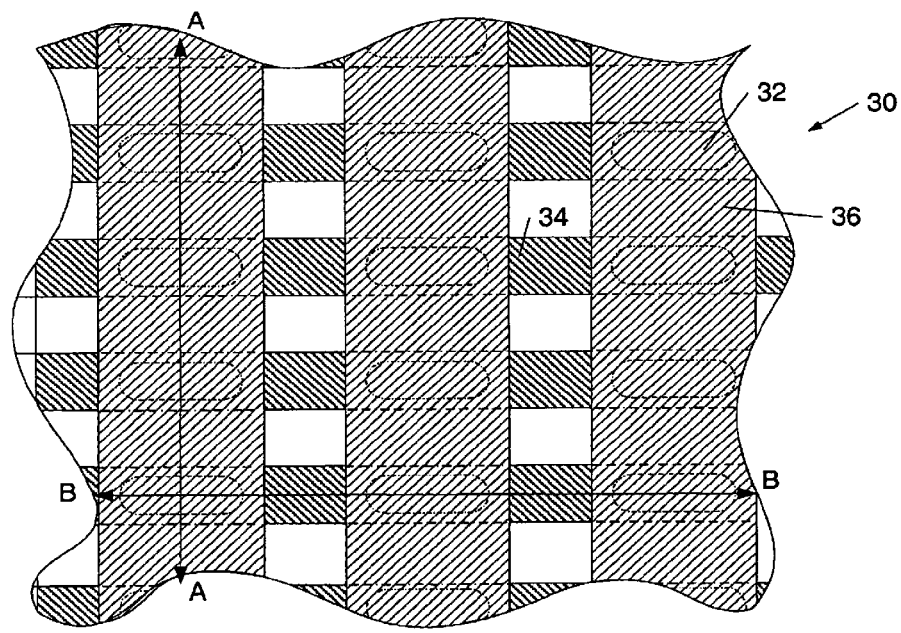
FIG. 1 depicts a partial top view of a semiconductor topography including a plurality of memory cells interposed between a plurality of bit lines and digit lines.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
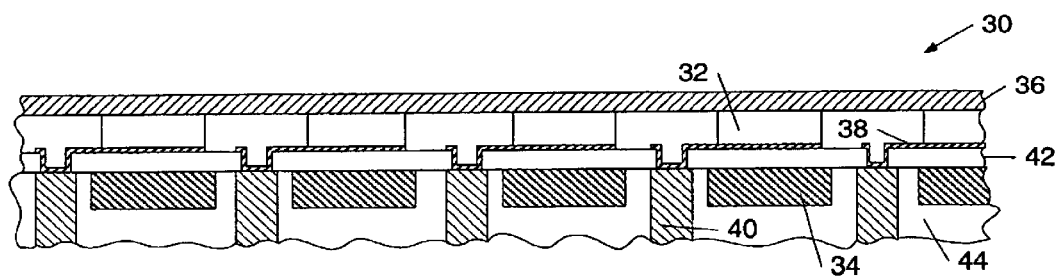
FIG. 2 depicts a partial cross-sectional view of the semiconductor topography of FIG. 1 along line AA.
Figure 3:
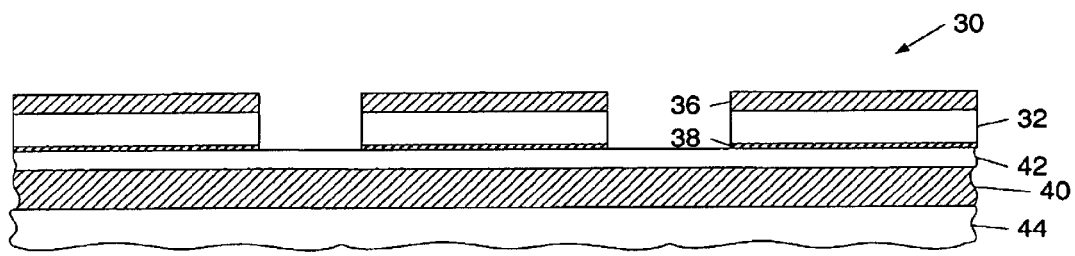
FIG. 3 depicts a partial cross-sectional view of the semiconductor topography of FIG. 1 along line BB.

Turning to the drawings, exemplary embodiments of methods for processing a semiconductor topography are shown in FIGS. 1–26. In particular, methods for forming a magnetic field shield (MFS) layer upon a semiconductor topography are provided. FIG. 1 depicts a partial top view of semiconductor topography 30 in which a plurality of memory cells 32 have been arranged between a plurality of digit lines 34 and a plurality of bit lines 36. A partial cross-sectional view of semiconductor topography 30 along line AA is shown in FIG. 2. In contrast, a partial cross-sectional view of semiconductor 30 along line BB is shown in FIG. 3. As shown in FIGS. 1–3, bit lines 36 overly memory cells 32 and respective underlying portions of digit lines 34. As such, memory cells 32 and respective underlying portions of digit lines 34 are represented by dashed lines in FIG. 1, indicating that they are arranged below bit lines 36. In addition, bit lines 36 are arranged perpendicular to the direction to which digit lines 34 are arranged. Consequently, portions of digit lines 34 not covered by bit lines 36 are not outlined by dashed lines. In general, semiconductor topography 30 may include a plurality of die portions formed upon a wafer. In this manner, the method described herein may be conducted during the fabrication process of the devices. Such an embodiment may be referred to as processing the semiconductor topography at the "wafer level." In other embodiments, semiconductor topography 30 may include a single die portion separated from a wafer. In such an embodiment, the method described herein may be conducted during the packaging process of the device.

Semiconductor topography 30 may also include other structures and layers, such as electrodes 38, conductors 40, and dielectrics 42 and 44. In particular, electrodes 38 may be spaced above digit lines 34 by dielectric 42 and conductors 40 may be laterally spaced apart from digit lines 34 by dielectric 44. Such layers and structures are shown in FIGS. 2 and 3, but are not shown in FIG. 1 to simplify the illustration of FIG. 1. In addition, semiconductor topography 30 may include other structures and layers not shown in FIGS. 1–3. In particular, semiconductor topography 30 may include additional structures and/or layers arranged above, below and in-between the structures and layers shown in FIGS. 1–3. For example, semiconductor topography 30 may include gate structures, interlevel dielectrics, contacts, vias, and interconnect lines. Moreover, semiconductor topography 30 may continue beyond the edges of the topography shown in FIGS. 1–3. In this manner, semiconductor topography 30 may include additional structures and layers arranged adjacent to the layers and structures shown in FIGS. 1–3. In some embodiments, such additional structures and layers may be substantially similar to the layers and structures of FIGS. 1–3.

As noted above, memory cells 32 may be interposed between bit lines 36 and digit lines 34. In general, bit lines 36 and digit lines 34 may be adapted to pass current and therefore may be made of any conductive material, such as aluminum, copper, titanium, tungsten, or any alloy of such metals. In some embodiments, bit lines 36 and/or digit lines 34 may include a plurality of these metals and/or alloys such that a stack of conductive material may be included within the lines. In either case, memory cells 32 may be adapted to pass current from bit lines 36 through memory cells 32 such that information may be retrieved or "read" from the memory cells. In such an embodiment, current may pass through electrodes 38 and conductors 40 to transistors residing below. In other cases, memory cells 32 may be adapted to allow current to pass through bit lines 36 such that information may be programmed or "written" to the memory cells. In such an embodiment, current may continue through bit lines 36 while additional current may be applied and conducted through digit lines 34. In an embodiment in which memory cells 32 are magnetoresistive random access memory cells, such an adaptation to write and read to and from the memory cells may be controlled by magnetic fields applied to memory cells 32. In such a case, memory cells 32 may be a giant magnetoresistance (GMR) memory cells or magnetic tunnel junction (MTJ) memory cells.

FIG. 1 shows memory cells 32 in an elliptical shape. However, the magnetic field shield layer described herein may be formed above memory cells of any shape. It is noted that the shape of memory cells 32 shown in FIG. 1 is merely shown as an exemplary embodiment and the method described herein is not limited to devices including memory cells with such a shape. In some cases, a memory cell having an elongated dimension with respect to other dimensions of the cell may be advantageous for enabling the states of the cell to be switched more easily along one direction of the cell than along other directions. In particular, a magnetic field applied along the elongated portion of a memory cell may more easily switch the states of the cell than a magnetic field applied along a different portion of the memory cell. In general, the direction with respect to the memory cell by which magnetic fields may be applied such that switching is more easily obtained may be referred to as the "easy" axis of the memory cell. In contrast, the shorter dimension of the memory cell arranged perpendicular to the elongated portion may be referred to as the "hard" axis of the memory cell. In general, the hard axis of the memory cell may refer to the direction by which magnetic fields may be applied such that switching of the states of the cell is the most difficult to obtain.

FIG. 2 shows the cross-section of memory cells 32 along the hard axis of the cell and therefore, the cells are shown to be relatively narrow. FIG. 3, on the other hand, shows the cross-section of memory cells 32 along the easy axis of the cell. Consequently, the cross-sections of memory cells 32 are shown to be relatively wide in FIG. 3. In one embodiment, for example, the elongated portions of elliptical memory cells 32 may be approximately twice as large as the dimensions arranged perpendicular to such elongated portions. Other dimension configurations, however, may be appropriate depending on the design specifications of the device. In particular, the aspect ratio of memory cells 32 (i.e., the ratio of the elongated portion to the respective perpendicular dimension) may be infinitely smaller or larger than 2.0. As such, the method described herein may be used within memory cells including any aspect ratio. In some embodiments, memory cells 32 may be configured in a circular shape. In such an embodiment, the categorization of an elongated portion is not applicable, since the diameter of a circle does not change along any direction of a circle. In other embodiments, memory cells 32 may include an entirely different shape that does not include an elongated portion.

Figure 4:
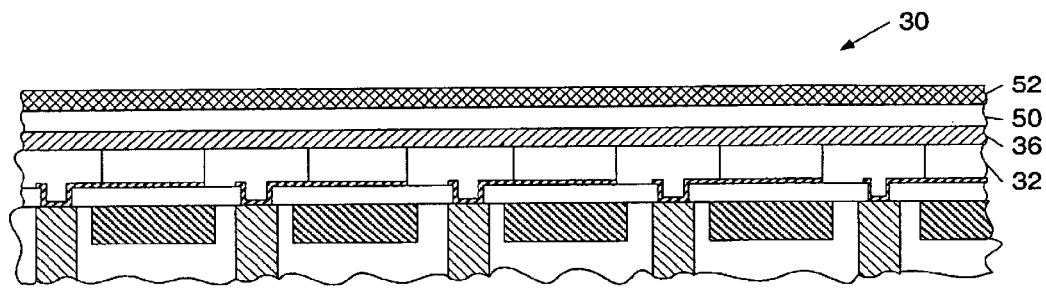
FIG. 4 depicts a partial cross-sectional view of the semiconductor topography along line AA in which a passivation layer and magnetic field shield layer are deposited upon the topography of FIG. 1.

Subsequent to the formation of semiconductor topography 30 as shown in FIGS. 1–3, passivation layer 50 and/or magnetic field shield (MFS) layer 52 may be formed upon upper surface of semiconductor topography 30. FIG. 4 illustrates a partial cross-sectional view of semiconductor 30 along line AA in an embodiment in which passivation layer 50 has been formed upon one of bit lines 36 and MFS layer 52 has been formed thereupon. In general, such layers may be formed over the entirety of semiconductor topography 30 and therefore, passivation layer 50 may be formed upon other exposed structures occupying the upper surface of semiconductor topography 30, such as electrode 38 or dielectric 42, for example. Such an arrangement of passivation layer 50 may be viewed in a partial cross-sectional view of semiconductor topography 30 along line BB as shown and described in FIG. 12 below.

In general, passivation layer 50 may include any material adapted to prevent the deterioration of semiconductor topography 30. In particular, passivation layer 50 may include any material adapted to protect semiconductor topography 30 from moisture, contaminants, and handling procedures. In addition, passivation layer 50 may include a dielectric such that a short is not caused with bit lines 36 or any other conductive layers or structures residing upon the upper surface of semiconductor topography 30. For example, passivation layer 50 may include a dielectric material, such as silicon dioxide ($SiO_2$), silicon nitride ($Si_xN_y$), silicon oxynitride ($SiO_xN_y(H_z)$), or silicon dioxide/silicon nitride/silicon dioxide (ONO). In addition, passivation layer 50 may be doped or undoped. As such, in some embodiments, passivation layer 50 may include borophosphorus silicate glass (BPSG), phosphorus silicate glass (PSG), or fluorine silicate glass (FSG). In addition, passivation layer 50 may be deposited on semiconductor topography 30 using chemical-vapor deposition ("CVD"), physical vapor deposition ("PVD"), or high density plasma ("HDP"). In either case, passivation layer 50 may be deposited from a gas that may include, for example, $SiH_4$ and $O_2$. In general, passivation layer 50 may have a thickness between approximately a few hundred angstroms to approximately several microns, although larger or smaller thickness may be appropriate depending on the design specifications of the device.

MFS layer 52 may include any material adapted to prevent magnetic fields from permeating through the material. Such material may be referred to as having a high magnetic permeability. In other words, such a material may be adapted to channel the magnetic fields such that they do not penetrate through to underlying structures and layers. In general, the magnetic permeability of a material is dependent on the deposition conditions of the material, stoichiometry of the material, and the operating frequency of the device in which the material is included. As such, MFS layer 52 may be deposited at a temperature preferably less than or equal to 350° C. Such a deposition process may include techniques, such as, but not limited to, CVD, PVD, HDP, and plating.

In some embodiments, MFS layer 52 may include ferromagnetic materials. Examples of ferromagnetic materials may include, for example, iron, nickel zinc, nickel iron, manganese zinc, cobalt iron, rubidium, and various combinations thereof. In general, ferromagnetic materials may be categorized as ferrite and non-ferrite materials. Ferrite materials may refer to materials, which include iron oxide in combination with ferromagnetic materials. In this manner, ferrite materials may serve as dielectrics. Non-ferrite materials, on the other hand, may refer to any ferromagnetic materials substantially absent of iron oxide, and therefore are not dielectrics. As such, in some embodiments, MFS layer 52 may include ferrite ferromagnetic materials and in other embodiments, MFS layer 52 may include non-ferrite ferromagnetic materials. In yet other embodiments, MFS layer 52 may include both ferrite and non-ferrite ferromagnetic materials. As such, MFS layer 52 may include one or more layers. In some cases, MFS layer 52 may include additional layers, which do not include ferromagnetic materials. For example, MFS layer 52 may include one or more non-ferromagnetic dielectric layers interposed between one or more ferromagnetic layers. Such non-ferromagnetic dielectric layers may include, for example, silicon dioxide, silicon nitride, silicon oxynitride, silicon dioxide/silicon nitride/silicon dioxide, or any other dielectric used in the semiconductor industry.

Figure 5:
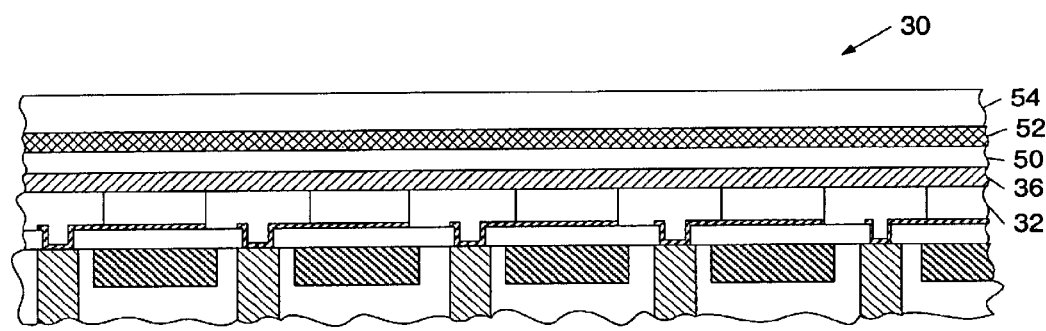
FIG. 5 depicts a partial cross-sectional view of the semiconductor topography along line AA in which a masking layer is deposited subsequent to the deposition of the magnetic field shield layer in FIG. 4.

Subsequent to the deposition of MFS layer 52, masking layer 54 may be deposited upon MFS layer 52 as shown in FIG. 5. In some embodiments, masking layer 54 may include a photoresist material, such as a deep ultraviolet resist, an I-line resist, a G-line resist, or another resist, such as an e-beam resist or an x-ray resist. In other embodiments, masking layer 54 may include a hard mask material. In either embodiment, masking layer 54 preferably has different etch characteristics than MFS layer 52. In general, masking layer 54 may be adapted for patterning MFS layer 52 and in some embodiments, may be further adapted for patterning passivation layer 50. For example, masking layer 54 may be used to pattern bond pad 56 into MFS layer 52 and passivation layer 50 as shown in FIG. 6.

Figure 6:
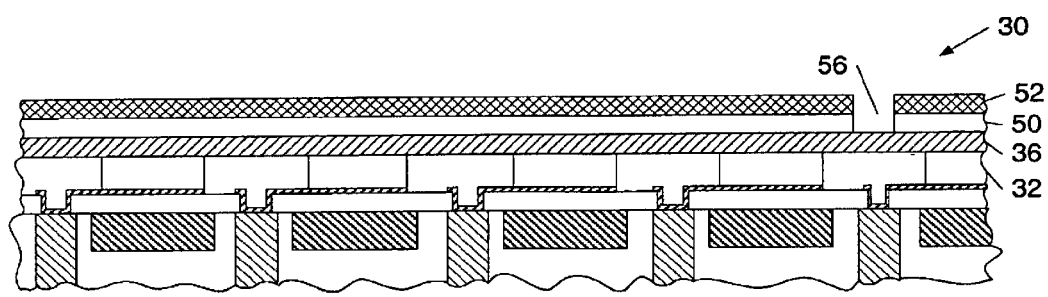
FIG. 6 depicts a partial cross-sectional view of the semiconductor topography along line AA in which a bond pad is formed subsequent to the deposition of the masking layer in FIG. 5.

Although FIG. 6 illustrates the formation of only one bond pad, any number of bond pads may be formed across semiconductor topography 30 in accordance with design specifications of the device, including those included in other cross-sectional views of semiconductor topography 30. In addition, the bond pads may be formed with various widths and depths in accordance with the design specifications of the device and/or the device package specifications. In general, bond pad 56 may be used for connection to interconnects of semiconductor topography 30. Patterning of bond pad 56 may be conducted by lithography and wet or dry etching techniques used in the art of semiconductor fabrication. More specifically, the formation of bond pad 56 may include patterning masking layer 54 and thereafter etching exposed portions of MFS layer 52 and passivation layer 50. In some embodiments, masking layer 54 may be removed subsequent to patterning bond pad 56 to produce the topography shown in FIG. 6. In general, the removal process may include a stripping process, such as a wet etch or a reactive ion etch stripping process.

Figure 7:
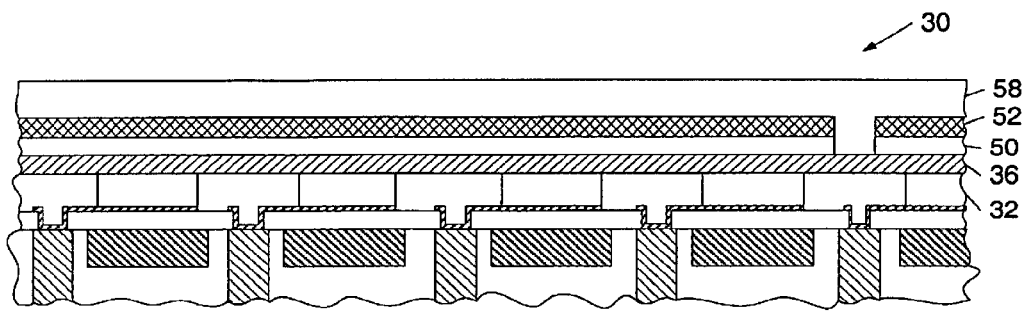
FIG. 7 depicts a partial cross-sectional view of the semiconductor topography along line AA in which a different masking layer is deposited subsequent to the formation of the bond pad in FIG. 6.

In some cases, the method for fabricating the magnetic field shield may terminate at the step of FIG. 6. In this manner, the entirety of semiconductor topography 30 with the exception of bond pad 56 may be protected from external or stray magnetic fields. In other embodiments, however, the method may continue with further patterning of MFS layer 52. In such an embodiment, for example, second masking layer 58 may be deposited upon semiconductor topography 30 subsequent to the formation of bond pad 56 as shown in FIG. 7. In a preferred embodiment, masking layer 54 is removed prior to the formation of second masking layer 58. In this manner, the method for forming a magnetic field shield layer may include using two distinct masking layers. In general, masking layer 58 may include the same type of material as those used for masking layer 54. As such, masking layer 58 may include a photoresist material, such as a deep ultraviolet resist, an I-line resist, a G-line resist, or another resist, such as an e-beam resist or an x-ray resist. In other embodiments, masking layer 58 may include a hard mask material. In some cases, masking layer 58 may include the same material as used for masking layer 54. In other cases, masking layer 58 may include a different material than used for masking layer 54.

Figure 8A:
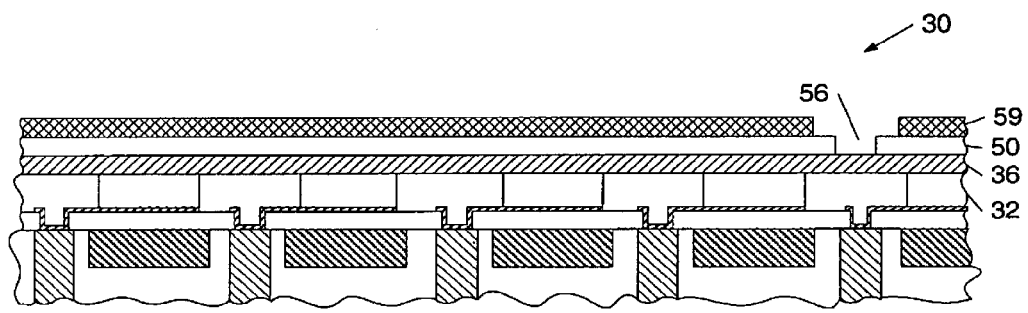
FIG. 8a depicts a partial cross-sectional view of the semiconductor topography along line AA in which the magnetic field shield layer is patterned subsequent to the deposition of the different masking layer in FIG. 7.
Figure 8B:
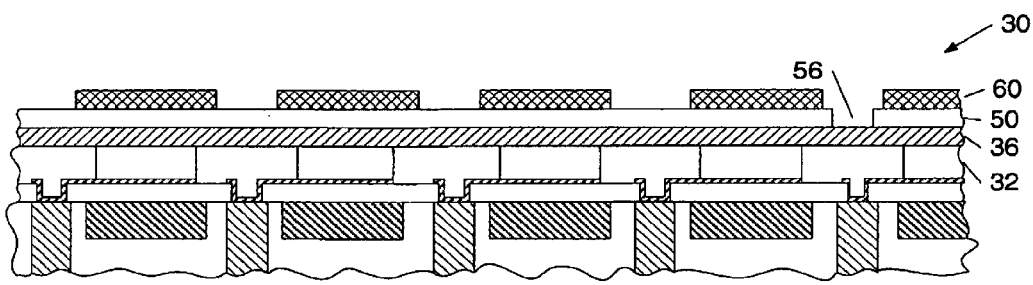
FIG. 8b depicts a partial cross-sectional view of the semiconductor topography along line AA, in an alternative embodiment, in which the magnetic field shield layer is patterned subsequent to the deposition of the different masking layer in FIG. 7.
Figure 9:
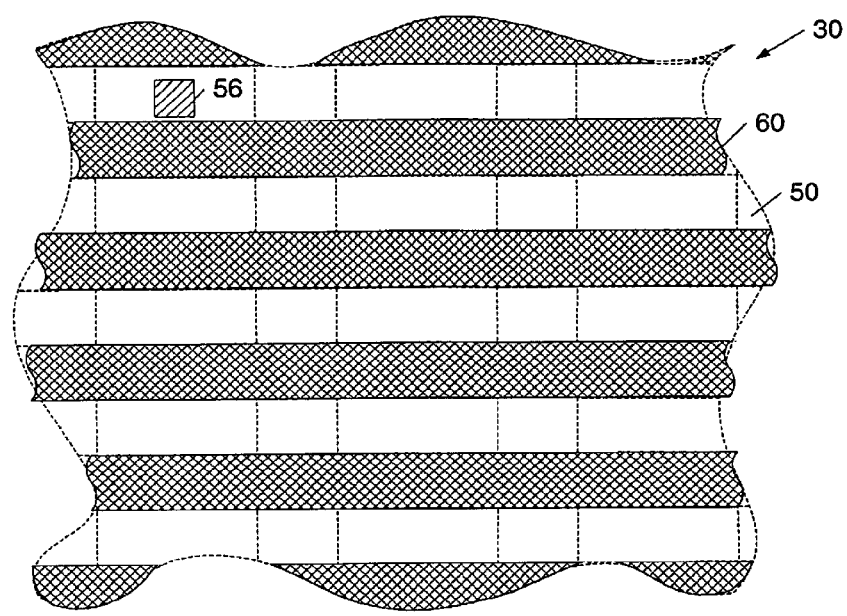
FIG. 9 depicts a partial top view of the semiconductor topography subsequent to the patterning of the magnetic field shield layer in FIG. 8b.

FIGS. 8a and 8b illustrate different embodiments of semiconductor topography 30 subsequent to patterning masking layer 58, etching exposed portions of MFS layer 52, and removing remaining portions of masking layer 58. In particular, FIG. 8a illustrates patterned MFS layer 59 subsequent to such a process. Patterned MFS layer 59, in such an embodiment, exposes portions of passivation layer 50 at the periphery of bond pad 56. Such an exposure may prevent a short from occurring between MFS layer 59 and bit lines 36 or any other conductive layers and/or structures residing upon the upper surface of semiconductor topography 30. Such a configuration may be particularly advantageous in embodiments in which a non-ferrite ferromagnetic material is used for the MFS layer. In other embodiments, however, such an exposure of passivation layer 50 about bond pad 56 may not be necessary. In particular, in embodiments in which a ferrite ferromagnetic material is used for the MFS layer, the step illustrated in FIG. 8a may not be needed since, a ferrite ferromagnetic material is a dielectric and therefore, will not cause a short with nearby conductive layers and/or structures. Alternatively, however, the processing step shown in FIG. 8a may be used with a topography including a ferrite ferromagnetic MFS layer.

In other embodiments, masking layer 58 may be patterned and etched to form patterned MFS layer 60 as shown in FIG. 8b. In such an embodiment, patterned MFS layer 60 may be formed such that only portions of MFS layer 52 comprise the upper surface of semiconductor topography 30. Such a configuration may be formed using either a ferrite or non-ferrite ferromagnetic MFS layer. In some embodiments, patterned MFS layer 60 may include portions aligned directly over memory cells 32. In particular, patterned MFS layer 60 may include portions adapted to shield the hard axes of memory cells 32. In addition or alternatively, patterned MFS layer 60 may include portions adapted to shield the easy axes of memory cells 32. In general, the shielding effect of a magnetic field shielding layer is perpendicular to the magnetic charges of the layer. As such, patterned MFS layer 60 may include portions aligned along the elongated portions of memory cells 32, as shown in the partial top view of semiconductor topography in FIG. 9, in embodiments in which shielding the hard axes of memory cells 32 is desirable. In some cases, patterned MFS layer 60 may additionally or alternatively include portions aligned along the shortened portions of memory cells 32, in embodiments in which shielding the easy axes of memory cells 32 is desirable. Such an embodiment is described in more detail below in reference to FIG. 22.

Other configurations of patterned MFS layer 60, however, may be appropriate depending on the design specifications of the device. For example, patterned MFS layer 60 may include portions aligned along the shortened axes of memory cells 32 as discussed below in the descriptions of FIGS. 18–23. Such an embodiment may be advantageous for shielding the easy axes of memory cells 32. Since the states of memory cells are more easily switched by magnetic fields applied along the easy axes of memory cells, shielding such a portion of semiconductor topography 30 may advantageously reduce the likelihood of switching the states of memory cells by stray or external magnetic fields. In other embodiments, patterned MFS layer 60 may include portions aligned at an angle with respect to the easy axes of memory cells 32 as described in FIG. 24 below. In particular, patterned MFS layer 60 may include portions aligned at an angle between approximately 0 degrees and approximately 90 degrees.

In yet other embodiments, semiconductor topography 30 may include memory cells, which are not configured to have easy or hard axes. In other words, semiconductor topography 30 may include memory cells with a circular configuration rather than a non-circular configuration as shown for memory cells 32 in FIG. 1. In either embodiment, patterned MFS layer 60 preferably includes portions arranged above the memory cells. As shown in FIG. 8b, MFS layer 60 may include portions that are wider than underlying respective memory cells 32. Alternatively, MFS layer 60 may include portions having widths substantially similar to the widths of memory cells 32. In either case, MFS layer 60 may further include portions arranged over other regions of semiconductor topography 30, as well.

Forming patterned MFS layer 60 may advantageously allow a thinner layer of MFS layer 52 to be deposited in FIG. 4 as compared to an embodiment in which MFS layer 52 is not patterned. For the purposes of comparing the thicknesses of patterned and unpatterned MFS layers, the specification of whether an MFS layer is to be patterned or not patterned may refer to whether the process of separately patterning the MFS layer to form patterns distinct from the bond pad pattern is included in the fabrication sequence of the device. As discussed below, the effective thickness of a MFS layer to serve as a functional magnetic field shield may be proportional to the area of the semiconductor topography, which is covered by the patterned or unpatterned MFS layer. In particular, an MFS layer to be patterned may include a thickness that is proportionally less than the thickness of an MFS layer in an embodiment in which the layer is not to be patterned. For example, a design layout that specifies MFS layer 52 to be unpatterned and have a thickness of approximately 3 microns may allow MFS layer 52, in an embodiment in which MFS layer 52 is specified to be patterned across approximately 50% of the topography, to have a thickness of approximately 1.5 microns. Such a case is merely described as an exemplary embodiment and therefore, MFS layer 52 may include any thickness that is within the design specifications of the device.

As discussed below, the thickness of MFS layer 52 may be dependent upon several design specifications of the device. However, in general, MFS layer 52 may include a thickness between approximately 5 angstroms and tens of microns. More specifically, MFS layer 52 may include a thickness between approximately 5 angstroms and approximately 100 angstroms. However, larger or smaller thicknesses of MFS layer 52 may be appropriate, depending on the design specifications of the device. The thickness of MFS layer 52 may refer to the thickness of the layer as it is deposited (e.g., in FIG. 4) regardless of whether the layer is specified to be patterned to form patterned MFS layer 52 or not. In general, the desired thickness of MFS layer 52 may be dependent upon the area of semiconductor topography 30, which is specified to be covered by patterned MFS layer 60 subsequent to patterning MFS layer 52 or by MFS layer 52 when the layer is not specified to be patterned. In particular, the effective thickness of MFS layer 52 to serve as a functional magnetic field shield may be proportional to the area of semiconductor topography 30 covered by patterned MFS layer 60 or unpatterned MFS layer 52. In particular, a thicker MFS layer may be needed for the relatively large area so that the layer does not become saturated. In other words, the less area of semiconductor topography 30 specified to be covered by a magnetic field shield layer, the thinner MFS layer 52 may be. As such, MFS layer 52 may be thinner in an embodiment in which patterned MFS layer 60 is formed as compared an embodiment in which MFS layer 52 is not patterned.

In addition, the thickness of MFS layer 52 may be dependent upon the strength of magnetic field vectors needed to switch the states of memory cells 32. In particular, the thickness of MFS layer 52 may need to be greater for shielding relatively high magnetic field as compared to shielding relatively low magnetic field. Furthermore, the materials used for MFS layer 52 and memory cells 32 may affect the thickness of MFS layer 52. In particular, MFS layer 52 may be thinner when it includes a material of high magnetic permeability as compared to when it includes a material of lower magnetic permeability. Moreover, MFS layer 52 may need to be thicker when memory cells 32 include MTJ configurations rather than GMR configurations, since MTJ configurations generally require lower magnetic fields to switch states of the cell.

Figure 10:
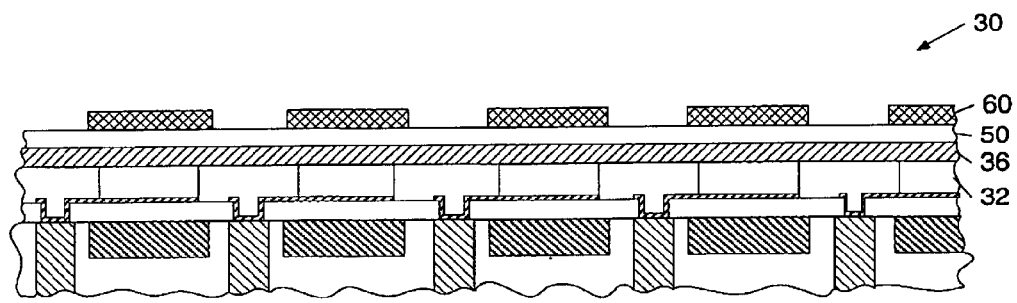
FIG. 10 depicts a partial cross-sectional view of the semiconductor topography along line AA, in an alternative embodiment, in which the magnetic field shield layer is patterned subsequent to the deposition of the masking layer in FIG. 5.
Figure 11:
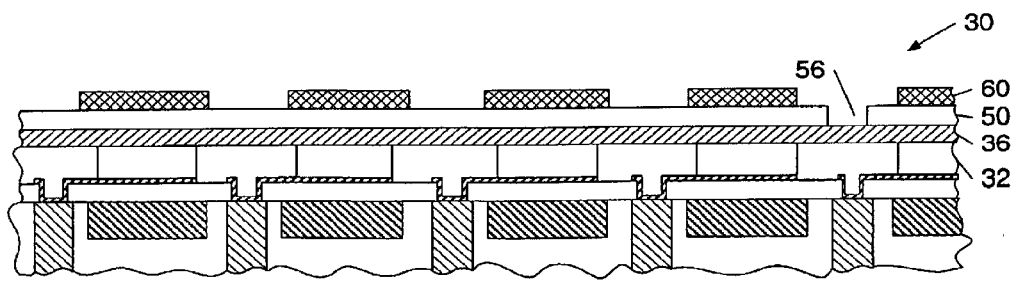
FIG. 11 depicts a partial cross-sectional view of the semiconductor topography along line AA in which a bond pad is formed subsequent to the patterning of the magnetic field shield layer in FIG. 10.

FIGS. 10 and 11 illustrate an alternative method for processing semiconductor topography 30. In particular, FIGS. 10 and 11 illustrate patterning MFS layer 52 prior to forming bond pad 56 subsequent to FIG. 5. As shown in FIG. 10, MFS layer 52 of FIG. 5 may be patterned to form patterned MFS layer 60 aligned over the easy axis of memory cells 32. As noted above in reference to FIG. 8a and 8b, MFS layer 52 may be patterned in a variety of configurations and thus is not restricted to the embodiment shown in FIG. 10. Such a patterning process may include patterning masking layer 54 (shown in FIG. 5), etching exposed portions of MFS layer 52, and removing remaining portions of masking layer 54 using similar lithography, etching, and stripping techniques described in FIGS. 5 and 6. The patterning process used to produce the semiconductor topography shown in FIG. 10, however, preferably does not include etching passivation layer 50. Instead, passivation layer 50 may be patterned subsequent to the formation of patterned MFS layer 60 as shown in FIG. 11. In this manner, bond pad 56 may be formed subsequent to the formation of patterned MFS layer 60.

In some cases, such a patterning process may include forming an opening within passivation layer 50 that is narrower than the spacing between portions of patterned MFS layer 60 as shown in FIG. 11. Such a configuration may prevent a short from occurring between MFS layer 60 and bit lines 36 or any other conductive layers and/or structures residing upon the upper surface of semiconductor topography 30. Such a configuration may be particularly advantageous in embodiments in which a non-ferrite ferromagnetic material is used for the MFS layer. In other embodiments, however, such an opening formation with passivation layer 50 may not be necessary. In particular, in embodiments in which a ferrite ferromagnetic material is used for the MFS layer, such a step may not be needed since, a ferrite ferromagnetic material is a dielectric and therefore, will not cause a short with nearby conductive layers and/or structures. Alternatively, however, such a processing step may be used with a topography including a ferrite ferromagnetic MFS layer. In either embodiment, the patterning process of passivation layer 50 may include depositing a different masking layer upon patterned MFS layer 60 and exposed portions of passivation layer 50. Such a masking layer may be distinct from masking layer 54 such that two masking layers may be used to form a magnetic field shield layer and a bond pad. The different masking layer may include similar materials as those specified for masking layer 54. In some embodiments, the different masking layer and masking layer 54 may include the same materials. In other embodiments, the different masking layer and masking layer 54 may include different materials.

Figure 12:
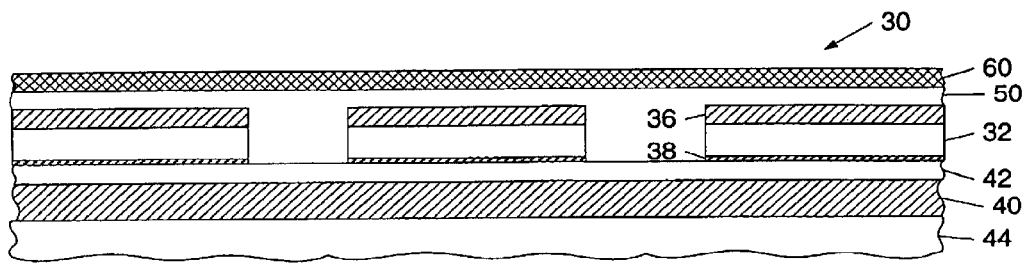
FIG. 12 depicts a partial cross-sectional view of the semiconductor topography along line BB subsequent to the formation of the bond pad in FIG. 11.

Subsequent to the deposition of the different masking layer, the different masking layer may be patterned and the exposed portions of passivation layer 50 may be etched to form bond pad 56. Thereafter, remaining portions of the different masking layer may be removed to produce the topography shown in FIG. 11. Consequently, FIG. 11 may include a similar cross-sectional profile as FIG. 8b. As such, the top view of semiconductor topography 30 in FIG. 11 may look similar to that of FIG. 9. FIG. 12 illustrates the partial cross-sectional view of semiconductor topography 30 along line BB for the two topographies depicted in FIGS. 8b and 11. In particular, FIG. 12 shows passivation layer 50 arranged about bit lines 36 and on portions of dielectric 42. Patterned MFS layer 60 is arranged upon passivation layer 50. Since line BB is not aligned along the plane of bond pad 56, bond pad 56 is not illustrated in FIG. 12. However, in some embodiments, such a cross-sectional view may include bond pads arranged within the semiconductor topography exposing portions of bit lines 36.

Figure 13:
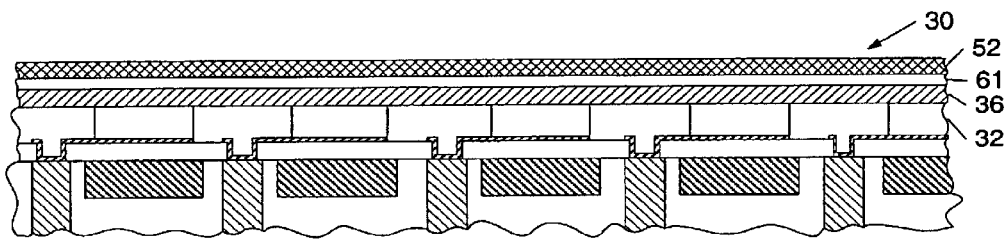
FIG. 13 depicts a partial cross-sectional view of the semiconductor topography along line AA, in an alternative embodiment, in which a magnetic field shield layer is deposited upon the topography of FIG. 1.

FIGS. 13–16 illustrate an alternative embodiment for processing semiconductor topography 30 subsequent to FIGS. 1–3. In particular, FIGS. 13–16 illustrate an embodiment in which MFS layer 52 is deposited upon semiconductor topography 30 and patterned prior to the deposition of passivation layer 50 and the formation of bond pads. FIG. 13 illustrates a partial cross-sectional view of semiconductor topography 30 along line AA of FIG. 1 with MFS layer 52 and dielectric layer 61 arranged upon one of bit lines 36. In general, dielectric layer 61 and MFS layer 52 may be formed over the entirety of semiconductor topography 30 and therefore may be formed upon other exposed structures occupying the upper surface of semiconductor topography 30, such as electrode 38 or dielectric 42, for example. Such an arrangement of MFS layer 52 may be viewed in a partial cross-sectional view of semiconductor topography 30 along line BB as shown and described in FIG. 17 below.

In general, dielectric layer 61 may serve to insulate underlying conductive layers and structures from MFS layer 52. As such, dielectric layer 61 may include materials such as silicon dioxide, silicon nitride, silicon oxynitride, or silicon dioxide/silicon nitride/silicon dioxide. In addition, MFS layer 52 may include ferrite and/or non-ferrite materials, in such an embodiment. In other cases, however, dielectric layer 61 may be omitted from semiconductor topography 30 such that MFS layer 52 is deposited directly upon bit lines 36 and adjacent regions of the topography. In such an embodiment, MFS layer 52 preferably includes a dielectric material such that a short may be prevented to bit lines 36. As such, MFS layer 52, in such an embodiment, may include ferrite materials. The thickness of MFS layer 52, in either embodiment, may depend on the design specifications of the device as described above in reference to FIGS. 4–9. In particular, the thickness of MFS layer 52 may depend upon the pattern configuration of MFS layer 52 later in the fabrication process.

Figure 14:
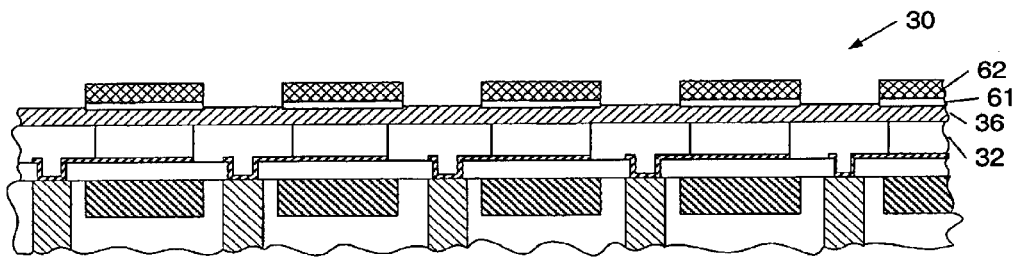
FIG. 14 depicts a partial cross-sectional view of the semiconductor topography along line AA in which the magnetic field shield layer is patterned subsequent to the deposition of the magnetic field shield layer in FIG. 13.
Figure 15:
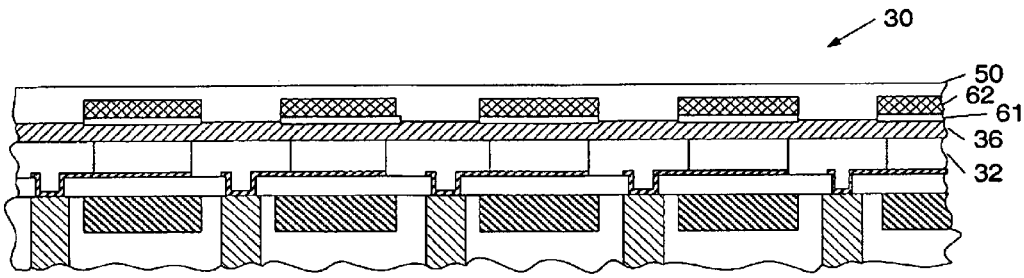
FIG. 15 depicts a partial cross-sectional view of the semiconductor topography along line AA in which a passivation layer is deposited subsequent to the patterning of the magnetic field shield layer in FIG. 14.
Figure 16:
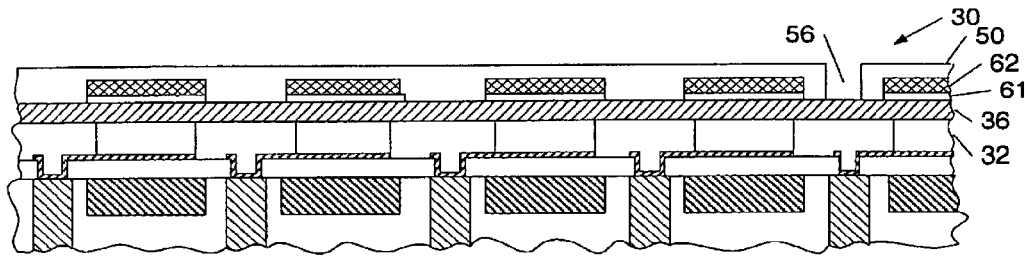
FIG. 16 depicts a partial cross-sectional view of the semiconductor topography along line AA in which a bond pad is formed subsequent to the deposition of the passivation layer in FIG. 15.

In some embodiments, MFS layer 52 may be patterned to form patterned MFS layer 62 as shown in FIG. 14. More specifically, MFS layer 52 may be patterned to form patterned MFS layer 62 in alignment with the shortened dimensions of memory cells 32. In this manner, the top view of the topography of FIG. 14 may look similar to the partial top view of FIG. 9 with the addition or dielectric 61 and the exclusion of passivation layer 50 and bond pad 56. Other pattern configurations, however, may be appropriate depending on the design specifications of the device as discussed in reference to FIGS. 8a and 8b above. In addition, the patterning process of MFS layer 52 may include patterning dielectric layer 61 as shown in FIG. 14. Alternatively, dielectric layer 61 may not be patterned during such a process step and may remain over semiconductor topography 30. Subsequent to forming patterned MFS layer 62, passivation layer 50 may be deposited upon patterned MFS layer 62 and exposed portions of bit lines 36 as shown in FIG. 15. In some embodiments, passivation layer 50 may further be deposited upon exposed portions of dielectric layer 61. Such a deposition process may include similar techniques described in FIG. 4 above. Passivation layer 50 may then be patterned to form bond pad 56 as shown in FIG. 16. In cases in which dielectric layer 61 is not patterned with MFS layer 52, the patterning of passivation layer 50 may further include patterning dielectric layer 61 such that a portion of bit lines 36 may be exposed.

Figure 17:
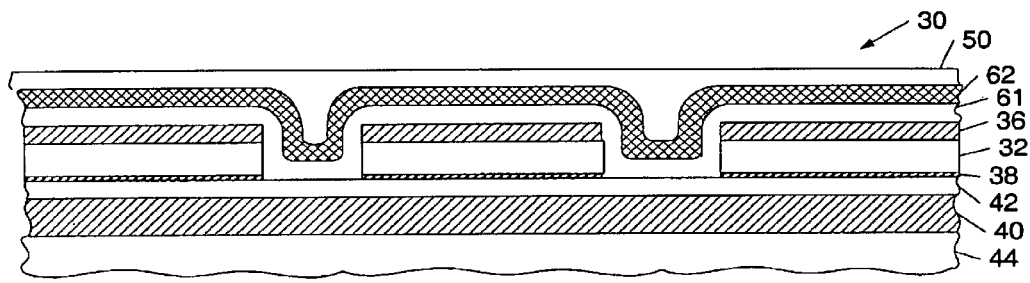
FIG. 17 depicts a partial cross-sectional view of the semiconductor topography along line BB subsequent to the formation of the bond pad in FIG. 16.

A cross-sectional view of semiconductor topography 30 along line BB subsequent to the formation of patterned MFS layer 62 and bond pad 56 is illustrated in FIG. 17. In particular, FIG. 17 shows patterned MFS layer 62 and dielectric layer 61 arranged about bit lines 36 and on portions of dielectric 42. Passivation layer 50 is arranged upon patterned MFS layer 62. Since line BB is not aligned along the plane of bond pad 56, bond pad 56 is not illustrated in FIG. 17. However, in some embodiments, such a cross-sectional view may include bond pads arranged within the semiconductor topography exposing portions of bit lines 36. In general, the patterning processes of MFS layer 52 and passivation layer 50 may include similar lithography and etching techniques as those described in FIGS. 5–8 and 10–11 above. In particular, the patterning processes may each include depositing a masking layer upon the material to be patterned, patterning the masking layer, etching the exposed portions of the material, and removing the remaining portions of the masking layer. In this manner, the method for forming bond pad 56 and patterned MFS layer 62 may include two distinct masking layers.

Figure 18:
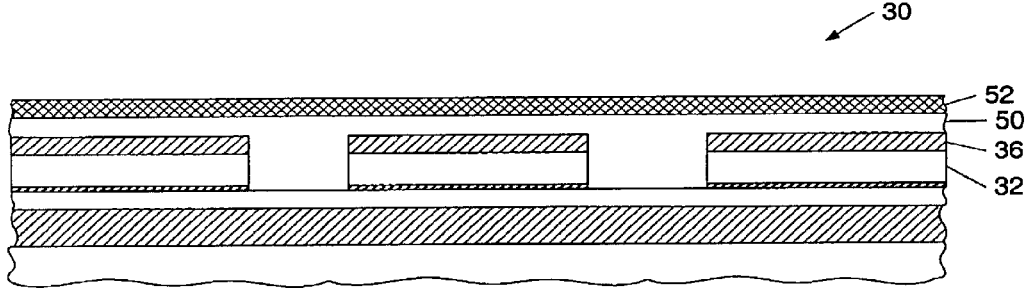
FIG. 18 depicts a partial cross-sectional view of the semiconductor topography along line BB, in an alternative embodiment, in which a passivation layer and a magnetic field shield layer is deposited upon the topography of FIG. 1.

FIGS. 18–22 illustrate an alternative embodiment of processing semiconductor topography 30 subsequent to FIG. 4. In particular, FIGS. 18–22 illustrate an exemplary embodiment of forming a patterned MFS layer in alignment with the shortened dimensions of memory cells 32. In this manner, FIGS. 18–22 may illustrate an embodiment in which the easy axes of memory cells 32 are shielded from external magnetic fields. FIG. 18 illustrates a partial cross-sectional view of semiconductor topography 30 along line BB subsequent to the deposition of passivation layer 50 and MFS layer 52 as described in reference to FIG. 4 above. As shown in FIG. 18, passivation layer 50, in such an embodiment, may be formed upon bit lines 36 and exposed portions of dielectric 42.

Subsequently, MFS layer 52 may be patterned to form patterned MFS layer 64 in alignment with the shortened portions of memory cells 32. As stated above, the shielding effect of a magnetic field shielding layer is perpendicular to the magnetic charges of the layer. In this manner, patterned MFS layer 64 may be adapted to shield the easy axes of memory cells 32 as described in more detail below in reference to FIG. 22. Since the states of memory cells are more easily switched by magnetic fields applied along the easy axes of memory cells, shielding such a portion of semiconductor topography 30 may advantageously reduce the likelihood of switching the states of memory cells by stray or external magnetic fields. The formation of patterned MFS layer 64 may be similar to that of patterned MFS layer 60 in FIG. 10 above. In particular, the formation of patterned MFS layer 64 may include patterning a masking layer formed upon MFS layer 52, etching exposed portions of MFS layer 52, and removing remaining portions of the masking layer.

Figure 20:
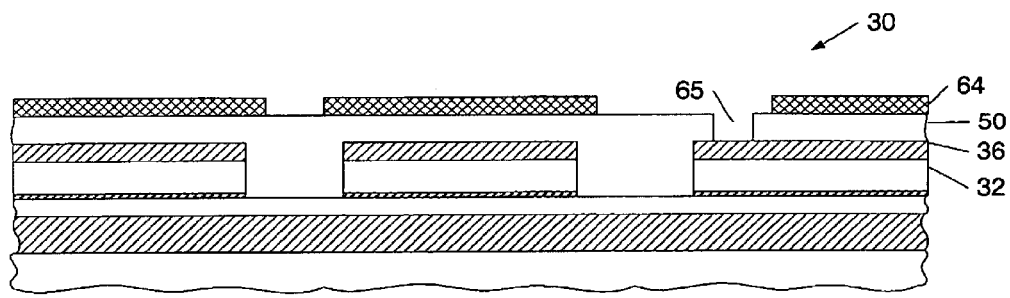
FIG. 20 depicts a partial cross-sectional view of the semiconductor topography along line BB in which a bond pad is formed subsequent to the patterning of the magnetic field shield layer in FIG. 19.

Underlying passivation layer 50 may then be patterned to form bond pad 65. Bond pad 65 and adjacent patterned MFS layer 62 are preferably spaced such that a short is prevented when the device is wire-bonded to bond pad 65. Patterning of bond pad 65 may be conducted by similar lithography and etching techniques used in reference to FIGS. 8a and 8b above. More specifically, patterning of bond pad 65 may include patterning a masking layer upon patterned MFS layer 64 and exposed portions of passivation layer 50, etching exposed portions of passivation layer 50, and removing remaining portions of the masking layer. In this manner, more than one masking layer may be used to pattern MFS layer 52 and passivation layer 50. Although FIG. 20 illustrates the formation of a single bond pad, any number of bond pads may be formed across semiconductor topography 30 in accordance with design specifications of the device, including those included in other cross-sectional views of semiconductor topography 30. In addition, the bond pads may be formed with various widths and depths in accordance with the design specifications of the device.

Figure 19:
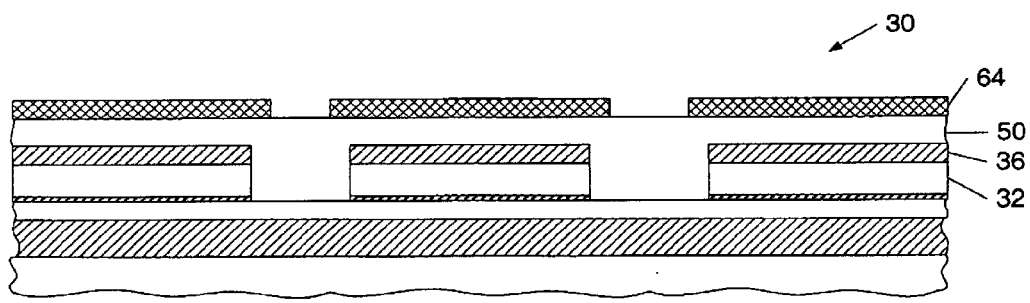
FIG. 19 depicts a partial cross-sectional view of the semiconductor topography along line BB in which the magnetic field shield layer is patterned subsequent to the deposition of the magnetic field shield layer in FIG. 18.
Figure 21:
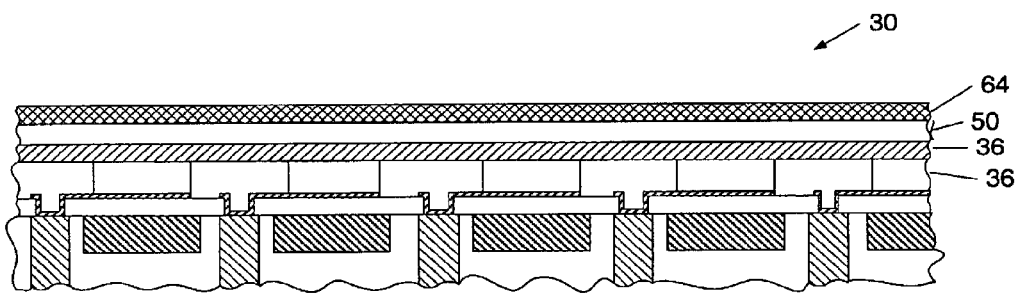
FIG. 21 depicts a partial cross-sectional view of the semiconductor topography along line AA subsequent to the formation of the bond pad in FIG. 20.
Figure 22:
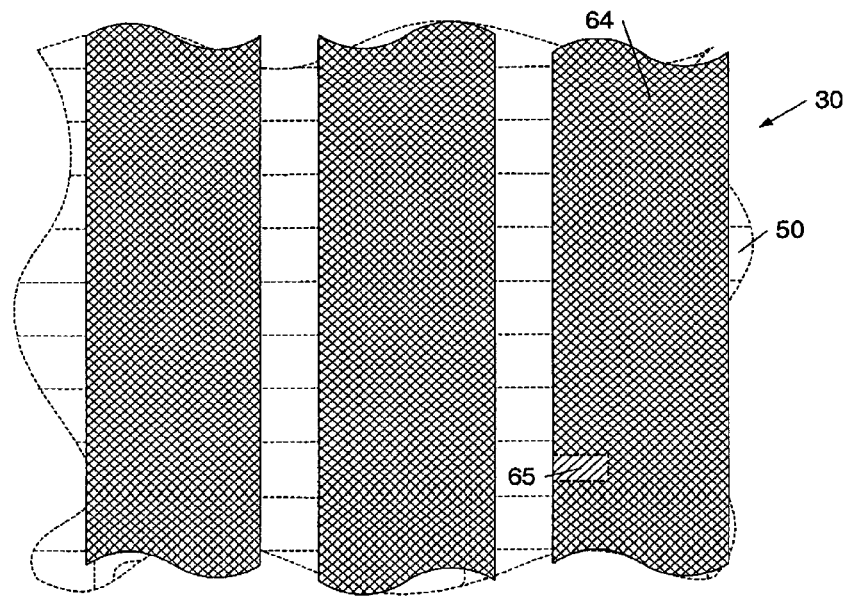
FIG. 22 depicts a partial top view of the semiconductor topography subsequent to the formation of the bond pad in FIG. 19.

A partial cross-sectional view of semiconductor topography 30 along line AA subsequent to the process described in FIGS. 18–20 is illustrated in FIG. 21. In particular, passivation layer 50 is shown arranged upon one of bit lines 36 and patterned MFS layer 64 arranged upon passivation layer 50. A partial top view of semiconductor topography 30 subsequent to the process described in FIGS. 18–20 is illustrated in FIG. 22. In particular, passivation layer 50 is shown arranged across semiconductor topography 30 with the exception of bond pad 65. In addition, patterned MFS layer 64 is shown arranged upon passivation layer 50 in alignment with the shortened dimensions of memory cells 32. In an alternative embodiment (not shown), the arrangement of passivation layer 50 and patterned MFS layer 62 may be reversed such that patterned MFS layer 64 is arranged upon bit lines 36 and passivation layer 50 may be arranged upon patterned MFS layer 64 and exposed portions of dielectric 42. In such an embodiment, a dielectric layer similar to that of dielectric layer 61 described in FIGS. 13–17 may be interposed between patterned MFS layer 64 and bit lines 36. Alternatively, such an embodiment may not include a dielectric layer interposed between patterned MFS layer 64. In either case, such an embodiment may include similar processing steps as those in FIGS. 13–16 as described above. However, such an alternative embodiment may include forming patterned MFS layer 64 in alignment with the shortened dimensions of memory cells 32 rather than in alignment with the elongated dimensions of memory cells 32.

Figure 23:
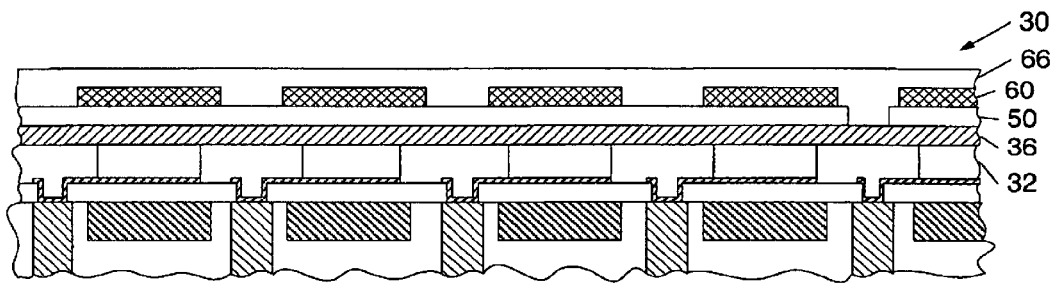
FIG. 23 depicts a partial cross-sectional view of the semiconductor topography along line AA in which an insulating layer is deposited subsequent to the patterning of the magnetic field shield layer in FIG. 8b.
Figure 24:
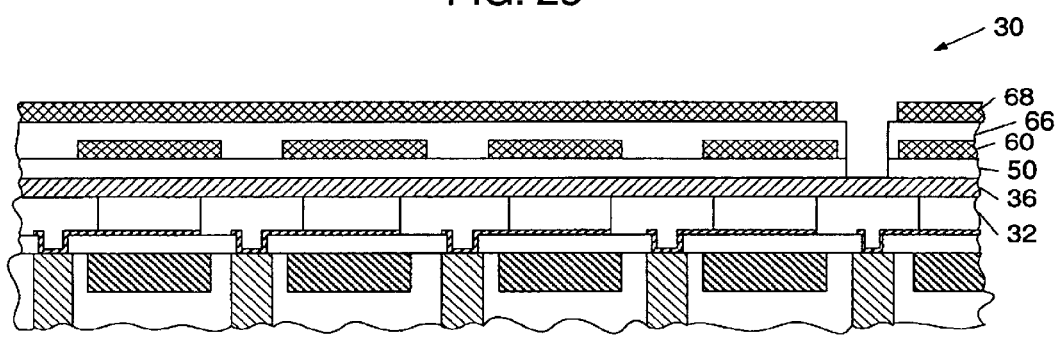
FIG. 24 depicts a partial cross-sectional view of the semiconductor topography along line AA in which another magnetic field shield layer is patterned subsequent to the deposition of the insulating layer in FIG. 23.
Figure 25:
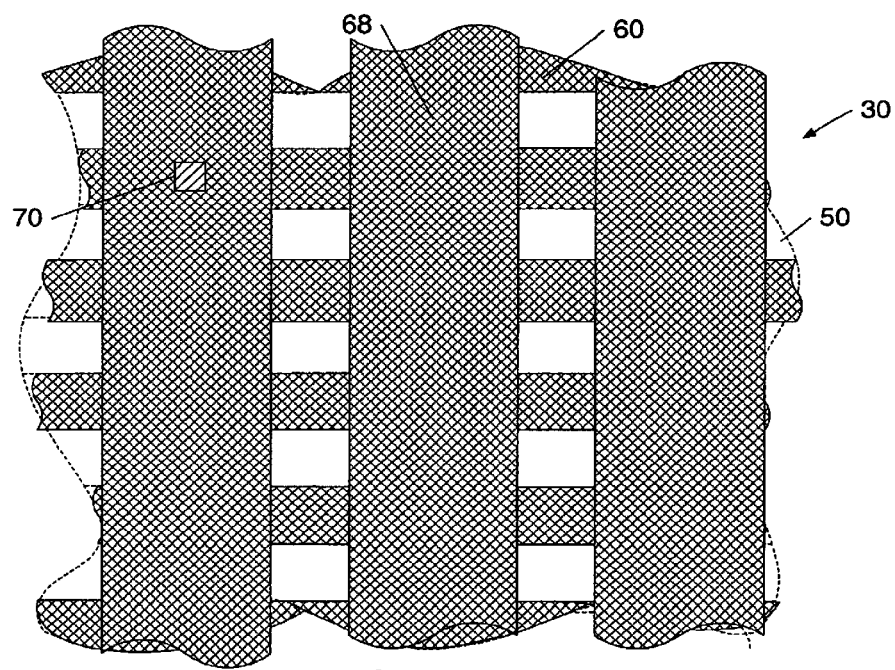
FIG. 25 depicts a partial top view of the semiconductor topography subsequent to the formation of the bond pad in FIG. 24.

In yet another embodiment, semiconductor topography 30 may be processed to include patterned MFS layers arranged in alignment with both the elongated and shortened dimensions of memory cells 32. In this manner, semiconductor topography 30 may include MFS layers adapted to shield both the easy and hard axes of memory cells 32. An exemplary fabrication process of such an embodiment is illustrated in FIGS. 23–25. In particular, FIG. 23 illustrates the formation of insulating layer 66 upon semiconductor topography 30 subsequent to the formation of patterned MFS layer 60 in FIG. 8b. Alternatively, insulating layer 66 may be deposited upon semiconductor topography 30 subsequent to the formation of patterned MFS layer 60 in FIG. 10. In either embodiment, FIG. 23 may illustrate the formation of insulating layer 66 upon a patterned MFS layer adapted to shield the hard axes of memory cells 32. Alternatively, insulating layer 66 may be formed upon a patterned MFS layer adapted to shield the easy axes of memory cells 32. The formation of such a layer, in such an embodiment, may be subsequent to the formation of patterned MFS layer 64 in FIG. 19, for example.

In either embodiment, patterned MFS layer 68 may be formed upon insulating layer 66 as shown in FIG. 24. Such a formation of an MFS layer may be similar to the process sequence described in FIGS. 18–22. In this manner, patterned MFS layer 68 may be aligned with the shortened portion of memory cells 32, and therefore adapted to shield the easy axes of memory cells 32. In an alternative embodiment, patterned MFS layer 68 may be formed aligned with the elongated portion of memory cells 32. Such a configuration may be particularly advantageous in an embodiment in which the patterned MFS layer underlying insulating layer 66 is aligned along the shortened dimensions of memory cells 32. In either embodiment, insulating layer 66 may serve to isolate patterned MFS layers 60 and 68. As such, insulating layer 66 may include any dielectric material, such as silicon dioxide, silicon nitride, or silicon oxynitride, for example. In addition, insulating layer 66 may allow each of the MFS layers to have two edges with which to shield external magnetic fields. In embodiments in which MFS layer 60 and 68 are not isolated from each other, the effect of shielding along a particular direction (i.e., along the easy or hard axis of memory cells 32) may be diminished or eliminated at the intersection of the two layers. Consequently, in such an embodiment, memory cells 32 may not be adequately shielded from external magnetic fields.

Subsequent to the formation of patterned MFS layer 68, bonding pad 70 may be formed within insulating layer 66 and passivation layer 50 to expose a portion of bit lines 36. A partial top view of semiconductor topography 30 subsequent to the formation of such a bond pad is illustrated in FIG. 25. In particular, FIG. 25 illustrates patterned MFS layers 60 and 68 formed above passivation layer 50. Insulating layer 66 is not shown in FIG. 25 such that patterned MFS layer 60 may be shown in relation to patterned MFS layer 68 for illustrative purposes. In addition, bit lines 36 and digit lines 34 are not shown since MFS layer 60 and 68 are formed above such structures. Although FIG. 25 illustrates patterned MFS layers 60 and 68 arranged above passivation layer 50, patterned MFS layers 60 and 68 may be arranged under passivation layer 50 and above bit lines 36 and dielectric 42. In such an embodiment, patterned MFS layer 60 may preferably include a dielectric, such as a ferrite material. Alternatively, semiconductor topography 30 may further include a dielectric layer, such as dielectric layer 61 described in FIGS. 13–17, interposed between patterned MFS layer 60 and bit lines 36. In such an embodiment, patterned MFS layer 60 may include any ferromagnetic materials, including ferrite and non-ferrite materials. In either embodiment, the method of forming passivation layer 50 and patterned MFS layers 60 and 68 may include any of the processing steps and design specifications described in FIGS. 1–22. Furthermore, FIG. 25 further includes bond pad 70, but may include additional bond pads as described in reference to FIG. 6 above.

Figure 26:
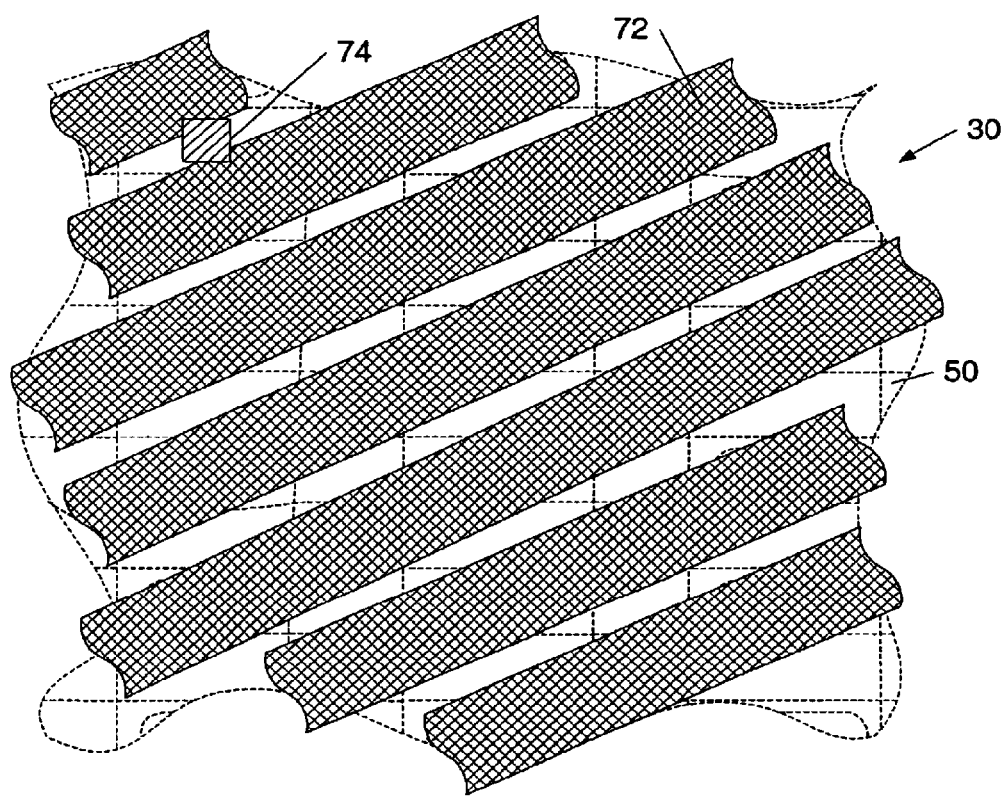
FIG. 26 depicts a partial top view of the semiconductor topography, in an alternative embodiment, in which an angled patterned magnetic field shield layer is formed upon the topography of FIG. 1.

FIG. 26 illustrates yet another embodiment in which angled MFS layer 72 is formed upon semiconductor topography 30. In general, angled MFS layer 72 may be formed at any angle with reference to the easy axes of memory cells 32. In particular, angled MFS layer 72 may be formed at any angle between 0 degrees and 90 degrees with respect to the easy axes of memory cells 32. In one embodiment, angled MFS layer 72 may be formed at 45 degrees relative to the easy axes of memory cells 32. However, larger and smaller angle of degrees of angle MFS layer 72 may be used depending on the design specifications of the device. Although FIG. 26 illustrates angled MFS layer 72 arranged above passivation layer 50, angled MFS layer 72 may be arranged under passivation layer 50 and above bit lines 36 and dielectric 42. In such an embodiment, angled MFS layer 72 may preferably include a dielectric, such as a ferrite material. Alternatively, semiconductor topography 30 may further include a dielectric, such as dielectric layer 61 described in FIGS. 13–17, interposed between angled MFS layer 72 and bit lines 36. In such an embodiment, angled MFS layer 72 may include any ferromagnetic materials, including ferrite and non-ferrite materials.

In either embodiment, the method of forming passivation layer 50 and angled MFS layer 72 may include any of the processing steps and design specifications described in FIGS. 1–22. Furthermore, FIG. 26 further includes bond pad 74, but may include additional bond pads as described in reference to FIG. 6 above. In yet another embodiment (not shown), semiconductor topography 30 may include angled cross-hatched MFS layers. In such an embodiment, the MFS layers may include portions arranged at different angles relative to the easy axes of memory cells 32. For example, in one embodiment, the angled MFS layer may be criss-crossed similar to the embodiment of FIG. 25.

It will be appreciated to those skilled in the art having the benefit of this disclosure that this invention is believed to provide a magnetic field shield layer for a magnetoresistive device and a method for fabricating such a layer. Further modifications and alternative embodiments of various aspects of the invention will be apparent to those skilled in the art in view of this description. For example, the magnetic field shield layer described herein may be patterned in any configuration, including line, ring, and dot patterns, depending on the design specifications of the device. It is intended that the following claims be interpreted to embrace all such modifications and changes and, accordingly, the drawings and the specification are to be regarded in an illustrative rather than a restrictive sense.

What is claimed is:

1. A semiconductor topography comprising:
    a magnetic field shield layer with a different pattern configuration than an adjacent passivation layer; and
    a magnetoresistive memory cell arranged below the magnetic field shield layer, wherein the pattern configuration of the magnetic field shield layer comprises portions of the magnetic field shield layer aligned at an angle greater than approximately 0 degrees and less than approximately 90 degrees relative to an elongated dimension of the magnetoresistive memory cell.

2. The semiconductor topography of claim 1, further comprising another magnetic field shield layer arranged in alignment with the elongated dimension of the magnetoresistive memory cell.

3. The semiconductor topography of claim 1, further comprising another magnetic field shield layer arranged in alignment with a shortened dimension of the magnetoresistive memory cell.

4. The semiconductor topography of claim 1, wherein the magnetic field shield layer comprises a ferromagnetic material.

5. A semiconductor topography comprising:
    a magnetoresistive memory cell;
    a ferromagnetic layer adapted to shield the magnetoresistive memory cell from external magnetic fields; and
    a passivation layer arranged above the ferromagnetic layer, and spanning the entirety of the semiconductor topography with exception to a region comprising a bond pad of the topography.

6. The semiconductor topography of claim 5, wherein the ferromagnetic layer is further adapted to protect underlying layers of the semiconductor topography from moisture.

7. The semiconductor topography of claim 5, wherein the ferromagnetic layer comprises a different patterned configuration than the passivation layer.

8. The semiconductor topography of claim 5, comprising one or more additional layers adapted to shield the magnetoresistive memory cell from external magnetic fields.

9. The semiconductor topography of claim 8, wherein the ferromagnetic layer and the one or more additional layers are spaced laterally adjacent to each other by one or more dielectric layers.

10. The semiconductor topography of claim 5, wherein the ferromagnetic layer spans the entirety of the semiconductor topography with exception to the region comprising the bond pad.

11. The semiconductor topography of claim 10, wherein the region extends a remote distance around the periphery of the bond pad.

12. The semiconductor topography of claim 10, wherein the semiconductor topography comprises a wafer.

13. The semiconductor topography of claim 10, wherein the semiconductor topography comprises a die.

14. The semiconductor topography of claim 5, wherein the ferromagnetic layer comprises a discrete segment arranged in alignment with one of the easy and hard axes of the magnetoresistive memory cell.

* * * * *